United States Patent [19]

Narcus

[11] 4,169,171

[45] Sep. 25, 1979

[54] BRIGHT ELECTROLESS PLATING PROCESS AND PLATED ARTICLES PRODUCED THEREBY

[76] Inventor: Harold Narcus, 15 Vesper St., Worcester, Mass. 01602

[21] Appl. No.: 876,895

[22] Filed: Feb. 13, 1978

Related U.S. Application Data

[63] Continuation-in-part of Ser. No. 849,165, Nov. 7, 1977.

[51] Int. Cl.$^2$ .............................................. C23C 3/02
[52] U.S. Cl. .................................. 427/264; 427/304; 427/305; 427/306; 427/307; 427/404; 427/430 A; 427/437; 427/438; 428/936
[58] Field of Search ................... 427/430 A, 437, 438, 427/304–306, 404, 264, 307

[56] References Cited

U.S. PATENT DOCUMENTS

| | | | |
|---|---|---|---|
| 2,817,774 | 6/1974 | Kuzmik | 427/304 |
| 3,915,809 | 10/1975 | Wheatley | 427/306 |
| 3,959,523 | 5/1976 | Grunwald et al. | 427/306 |
| 4,002,778 | 1/1977 | Bellis et al. | 427/304 |

OTHER PUBLICATIONS

Metal Finishing, p. 86, Sep. 1977.
Pearlstein, "Electroless Plating", Modern Electroplating, John Wiley & Sons, Inc., ©1974, pp. 710–729 and 734–739.

Primary Examiner—John D. Smith
Attorney, Agent, or Firm—Jerry Cohen

[57] ABSTRACT

An adherent bright metallic coating which may be any metal or alloy capable of being deposited electrolessly, is applied to the surface of a plastic or other dielectric part (or to a metal part) by an electroless process comprising suitable pretreatment of said surface, deposition of a primary electroless copper to produce an underlayer, then depositing a bright secondary electroless coating of the desired metal (the overlayer) with complete elimination of any subsequent electroplating process [usually required to achieve this brightness]. The required overlayer may also be limited to selected surface areas of a coated part by mechanically removing portions of the primary electroless copper prior to immersion of the part in the secondary electroless bath to produce the desired overlayer metal.

10 Claims, No Drawings

BRIGHT ELECTROLESS PLATING PROCESS AND PLATED ARTICLES PRODUCED THEREBY

CROSS REFERENCE TO RELATED APPLICATION

This application is a continuation-in-part of my copending application, Ser. No. 849,165, filed Nov. 7, 1977.

BACKGROUND OF THE INVENTION

The present invention relates to metal coating particularly for plastic and other dielectric articles.

Electroless or autocatalytic deposition of metallic coatings on non-conductive or dielectric surfaces, such as plastics, is a well known process with broad applications in diversified industries such as automotive, radio, television, plumbing, marine, home appliance, etc. However, for the benefit of clarity to the non-artisan, it is stated here electroless plating which is the subject of this invention and referred to frequently throughout this disclosure requires no electricity for metallic deposition while electroplating or electrodeposition requires its employment. The field is generally described in my book, "Metallization of Plastics" (Reinhold, New York 1960), see also the U.S. patents cited below.

Heretofore, the application of the electroless coating to surfaces of substrates [following pretreatment of said surfaces] was followed by the commonly used electroplating or electrodeposition process known to the industry particularly electroplated copper, nickel, chromium, gold, silver, etc., to achieve bright surfaces for decorative or functional purposes. These prior art processes involve chemical etching of the plastic substrate mainly to improve adherence of metal thereto, then sensitizing and activating this etched surface, applying a conductive film of silver, copper or nickel and electroplating of the desired metal upon this conductive film.

Recent improvements have eliminated the two-step treatment [i.e., 1—sensitizing and 2—activating] and replaced it with a one-step pretreatment involving colloidal solutions containing non-noble copper ions or noble palladium ions; then a conductive film of copper or nickel is formed and, finally, electroplating metal is applied.

As an example of the non-noble catalyst treatment referred to, the U.S. Pat. No. 4,020,197 issued to Steffen (Apr. 26, 1977) treats the plastic surface in a solution of cuprous chloride, acidified with 10–15% hydrochloric acid, followed by hydrolysis of the cuprous (1) compound to a hydrous oxide in hot water; then acceleration in an alkaline solution of sodium borohydride. Innumerable patents issued to Feldstein such as U.S. Pat. Nos. 3,993,799, 3,993,848, 3,993,801, 3,993,491, 3,993,799 and 3,982,054 also practice the employment of the so-called non-noble metal catalyst for treatment of non-conductive surfaces.

As an example of the noble catalyst referred to, a patent was issued to Shipley, U.S. Pat. No. 3,011,920 (Dec. 5, 1961) in which the noble metal, e.g., palladium, is applied directly to the dielectric surface in the form of a colloidal solution containing the metal in zero valence state. Normally, the metal is formed in the colloidal solution by introducing both palladium chloride and stannous chloride into a highly acidified (with hydrochloric acid) aqueous solution, the palladium ions being reduced within the solution to this zero valence state by the stannous ions. U.S. Pat. Nos. 3,672,938 issued June 27, 1972, to Zeblisky and 3,767,583 issued Oct. 23, 1973, to Fadgen and Saubestre also practice the use of the noble catalyst solution.

Processes of the above nature involving pretreatment and formation of a conductive film of copper or nickel for making the plastic conductive followed by electroplating have been commercially successful but have many technical and economic disadvantages.

From a technical point of view, intricate parts with blind-holes, threads, small diameter holes, slots, recesses or internal areas do not receive uniform electroplating because, by nature, certain plating baths have poor throwing power; for example, as in the case of chromium plating, and costly auxiliary anode assemblies, commonly employed in the industry must be used to plate into these extremely low current density areas. Excessive plated metal occurs on the high current density areas, such as sharp corners, protrusions, etc., while little or even no plating takes place in the low current density areas such as grooves, holes, slots, etc. In other words, uneven thickness of electrodeposits result due to the fact that the high current density areas receive more metal than the low current density areas.

Economically, the cost for applying an electroplated coating to the plastic is much greater because of the relatively thick deposits applied to the conductive film of copper or nickel. Excessive metal costs are incurred.

Furthermore, plastic parts, especially those large in size, require placement on plating racks for acceptable electroplating results. Fixture costs and labor for attaching the parts to said fixture bring about these additional process expenditures. Furthermore, unplated contact points appear where the parts are held on these fixtures which is highly objectionable in critical industrial applications.

There is a need for electroless plating compositions and processes producing bright deposits especially in the decoration of plastics which will overcome the aforementioned disadvantages while still being compatible with known commercial procedures. The present invention provides said compositions and processes.

While the application of bright electroless deposits, applied in bulk or mass handling, or with rack handling, is common practice when these deposits are applied to non-ferrous or ferrous substrates, the brightness can only be achieved by bright-dipping or polishing the metal substrate first to obtain these bright electroless finishes. Non-conductive surfaces are normally impossible to bright dip and polishing of non-conductive surfaces is not feasible since there would be a loss of adhesion of the electroless coating to the non-conductive surface due to the absence of mechanical or chemical interlocking of the metallic coating.

It is the principal object of the present invention to provide an effective and economical process for electrolessly applying attractive, bright metallic coatings to non-conductive surfaces, particularly a wide variety of synthetic resins, for example, acrylonitrile-butadiene-styrene (ABS), without the necessity of subsequent electroplating.

It is a further particular object of the present invention to provide a process whereby plastic parts, no matter how intricate in shape, form, or design, can receive a bright electroless coating uniformly deposited throughout the entire part without using costly racking and auxiliary anode assemblies to insure this uniform metal thickness in both high and low current density areas. In other words, the object is to provide a process wherein parts may be processed in bulk or in mass without the necessity of racking and still receive bright deposits of electroless metal with complete elimination of the need for electroplated deposits and related burdens of process and equipment.

SUMMARY OF THE INVENTION

The process of the present invention is applicable to the metallic coating, with a selected metal, of a wide variety of dielectric substrates but is best employed commercially to apply bright metallic coatings to plastics such as acrylonitrile-butadiene styrene (ABS). Other non-conductive substrates described in the prior art, including the broad range of thermoplastic and thermosetting resins, glass, ceramics, etc., may be suitably electrolessly coated with the desired metal with the present invention. In practice, these substrates are surface conditioned or etched in the manner known to the artisan prior to the electroless process in order to improve the adherence of the metallic underlayer. The etched substrate is then sensitized and activated in a one-stage or two-stage process (preferably one-stage) utilizing the noble or non-noble activator or catalyst previously discussed. The pretreated substrate is then coated with electroless copper, termed in this invention, the primary electroless coating (underlayer), applied from a special composition to produce a dense, levelled electroless copper deposited in proper thickness to act as a suitable foundation metal for receiving the secondary electroless metal possessing attractive brightness. This combination of a primary electroless copper and the secondary electroless metal gives a resulting bright, attractive uniform deposit to the plastic substrate. No subsequent electroplating such as with electroplated copper, nickel, chromium, as necessary in prior art, is further required in the present invention. And this constitutes an important improvement over existing commercial processes.

Parts of the primary electroless copper coating may be mechanically removed prior to applying the secondary electroless coating (the overlayer) by immersion of the substrate in the secondary electroless metal bath. The secondary coating (the overlayer) is produced only in those substrate surface areas having a primary copper underlayer. This feature of the present invention is also disclosed in my U.S. patent application Ser. No. 849,165, filed Nov. 7, 1977.

The primary electroless copper bath is maintained basic 11.5–13.5 pH (preferably 12.0–12.5) and the secondary electroless bath operates at pH values characteristic to the electroless metal bath being used.

In the primary electroless coating bath (the underlayer), solutions of copper salts in polar solvents (preferably aqueous) are employed together with a chelating agent, an alkaline pH adjusting chemical, reducer and bath stabilizer. The secondary electrolessly deposited metal (the overlayer) possesses similar addition agents in the particular bath but will vary according to which metal is being deposited. Examples of formulations for both the primary electroless copper and the secondary electroless overlayer metal are given below.

The resultant produce is characterized by high reflectivity and adhesion.

Other objects, features and advantages of the present invention will be apparent to those skilled in the art from the following detailed description of preferred embodiments thereof.

DETAILED DESCRIPTION OF PREFERRED EMBODIMENTS

More specifically, the improved process of the present invention is comprised of the following sequence of steps used, for example, with acrylonitrile-butadiene styrene (ABS) which is selected because of its excellent platability:

(1) Surface condition or etch the ABS using the conventional chromic acid-sulphuric acid aqueous solution.

(2) Rinse in water.

(3) Neutralize residual etch solution in a dilute sodium bisulfite solution.

(4) Rinse in water.

(5) Activate in the one-stage non-noble or noble catalyst solution.

(6) Rinse in water.

(7) Accelerate in an alkaline sodium borohydride or dilute fluoboric acid solution.

(8) Rinse in water.

(9) Apply the primary electroless copper (foundation metal).

(10) Apply the secondary electroless metal (bright deposit).

EXAMPLES 1–4 which follow are more specific illustrative (non-limiting) detailed descriptions of practice of the present invention as applied to plastic radio knobs molded in a platable grade of acrylonitrile-butadiene-styrene (ABS). All solutions and baths are aqueous.

EXAMPLE 1

(1) Etch the part in the conventional chromic acid-sulphuric acid solution of the following composition:
Chromic Acid ($CrO_3$) - 184 grams/liter
Sulphuric Acid ($H_2SO_4$) (66° Bé) - 368 grams/liter
Fluorad FC-95 - 1.0 gm/liter Fluorocarbon surfactant
Treatment - 5 minutes at 65°–70° C.

(2) Water rinse (3) Neutralize
Sodium bisulfite ($Na_2S_2O_4 \cdot 2 H_2O$ - 150–200 grams/liter)
Treatment - 1 minute at 25°–30° C.

(4) Water rinse (5) Activate (non-noble catalyst)
Acidified cuprous chloride solution (CuCl—HCl)
Treatment - 15 minutes at 40° C.

(6) Hot water rinse - 5 minutes (7) Acceleration
Sodium borohydride ($NaBH_4$) - 1 gram/liter
Sodium hydroxide (NaOH) - 1 gram/liter
Fluorad FC-95 surfactant (1% solution)- 1 ml/liter
Treatment - 10 minutes at 30° C.

(8) Water rinse (9) Primary Electroless Copper Bath Immersion
(bath composition)
| | |
|---|---|
| Copper sulphate ($CuSO_4 \cdot 5H_2O$) | 20 grams/liter |
| Trisodium salt of nitrilotriacetic acid (NTA . $Na_3$) | 50 grams/liter |
| Sodium hydroxide (NaOH) | 20 grams/liter |
| Sodium cyanide (NaCN) | .01–.02 grams/liter |
| Formaldehyde (37% by weight) | 30 grams/liter |

Operating Conditions
| | |
|---|---|
| Temperature | 25–30° C. |
| pH | 12.0–12.5 |
| Time | 30–60 minutes |

(10) Secondary Electroless Bath Immersion - to produce, for example, nickel overlayer - (bath composition)
| | |
|---|---|
| Nickel sulphate ($NiSO_4 \cdot 6 H_2O$) | 20 grams/liter |
| Lactic acid (80%) ($CH_3CHOH\ COOH$) | 30 grams/liter |
| Propionic acid ($CH_3 \cdot CH_2 \cdot COOH$) | 2 grams/liter |
| Lead acetate ($Pb(CH_3O_2)_2 \cdot 3HO$) | .001 grams/liter |
| Sodium hypophosphite ($NaH_2PO_2 \cdot H_2O$) | 25 grams/liter |

Operating Conditions
| | |
|---|---|
| Temperature | 70–90° C. |

| | |
|---|---|
| pH | 4.5–5.5 |
| Tie | 20–30 minutes |

As described in my previous U.S. application Ser. No. 849,165, filed Nov. 7, 1977, activation can be carried out [see also step 5 of EXAMPLE 1 herein] using either a non-noble or noble catalyst. In EXAMPLE 1, a non-noble catalyst, using acidified cuprous chloride solution, is shown with subsequent acceleration using alkaline sodium borohydride. A noble catalyst may also be used, e.g., the stannous chloride - palladium chloride colloidal type catalyst, using 10% fluoboric acid as the accelerator.

The end product comprises 6–12 weight percent of phosphorous in the overlayer because of hypophosphite reducing agent usage in the secondary electroless coating bath. The underlayer thickness is typically 0.05–0.15 mils and overlayer thickness is usually substantially greater. The bright overlayer has a reflectivity of 80–90% and is thicker and more brittle and/or has a greater surface hardness than the underlayer.

The hypophosite used may be ammonium—or alkali metal (i.e., Na, K, Li)—hypophosphite.

The general principles of the invention exemplified in the above example of primary and secondary electroless coating steps are as follows:

In the primary electroless copper bath, there is a dissolved copper salt, a chelating agent in sufficient amount to chelate at least as much copper as is sought to be deposited at desired deposition rates; one or more pH increasing means (e.g., a dissolved basic chemical such as an inorganic hydroxide or an amine) to establish the necessary basic pH operating condition, a stabilizer (e.g., the cyanide used above) and an active reducing agent (e.g., the formaldehyde used above or other reducing agents containing double or triple bonds, e.g., oximes, such as glyoxime, or hydrazine). The simultaneous chelation of metal ions and reduction reaction under pH controlled and stabilized conditions produces an extended period of copper coat deposition in coherent (within itself) and adherent (to a substrate) form at commercially practical high rates. The copper is very pure, usually 99.99% or higher and soft.

The secondary immersion bath uses a salt source of a metal to be coated; "exultant" chemicals known per se in the plating arts (e.g., the lactic and propionic acids used above) to prevent powdering or other particulation of the secondary coating; a stabilizer (e.g., the acetate) and a reducing agent containing phosphorous or boron [which will inevitably leave traces of such elements in the secondary coating, sometimes affecting the physical properties of the secondary coating—e.g., hardening it.] No chelation is utilized in the secondary coating. Separate brightness and pH adjusting means may also be added if their functions are not inherently satisfied by by the above mentioned components of the secondary bath.

The overlayer generally has a microhardness of 400–600 Vickers particularly when nickel and nickel alloys are deposited and is in any case preferably thicker and more brittle, and/or has a higher surface hardness, than the copper underlayer and a reflectivity of about 80–90% under standard reflectivity definition of the plating arts.

In the formulation given for the electroless copper in EXAMPLE 1, the ductility of the electroless copper (the underlayer) is excellent and the appearance of the deposit is close-grained, smooth and semibright. Its metallurgical properties are highly satisfactory for a foundation or underlayer highly receptive to receive the electroless overlayer.

The rate of deposition of this electroless copper (the underlayer) is 0.2–0.4 mils per hour under properly controlled bath composition with continuous filtration to insure against rapid decomposition from particles in the bath. Mechanical agitation is recommended and preferred over air agitation.

Other copper salts may be utilized as the source of copper metal such as the nitrate, acetate or chloride salts of copper in lieu of copper sulphate. Other chelating agents can be used in place of $NTA.Na_3$, [e.g., $PDTA.Na_4$ (tetrasodium salt of propylenediamine tetraacetic acid) and EDTA (ethylenediamine tetraacetic acid) or its tetra-sodium salt ($EDTA.Na_4$) or Rochelle Salts (i.e., sodium potassium tartrate) ($NaKC_4H_4O_6.4H_2$)]

Stabilizers, other than sodium cyanide, can be used, e.g., thiourea or mercaptobenzothiazole. Potassium hydroxide can be employed as the alkaline agent to replace sodium hydroxide.

There are many formulations for electroless copper baths used in industry and known to the artisan active in the field of metallizing plastics and printed circuitry but all require electroplating methods for completion of the process. Innumerable patents, technical jounals and trade brochures describe these baths and processes. The improvement set forth in this invention is the complete elimination of the electroplating process over the electroless copper given in EXAMPLE 1.

As revealed in my previous U.S. application Ser. No. 849,165, the overlayer electroless nickel bath and, likewise, the other (M) overlayer coatings covered subsequently in this present disclosure, have self-building brightness, i.e., the thicker the coating, the brighter the deposit.

This brightness is achieved, within the scope of this invention, by utilizing commercially available proprietary brighteners of the chemical classification used in the electrolytic baths.

Following the formation of the primary electroless copper (the underlayer), optionally, the copper coated substrate can be dipped in a 5% (by weight) sodium cyanide solution, rinsed well in water, then immersed in 10% (by volume) sulphuric acid solution and again rinsed prior to placing the part in the secondary electroless bath to insure a clean, active electroless copper surface.

Besides the application of a bright secondary (M) overlayer of copper or nickel, an adherent bright metallic coating of silver, gold, cobalt, tin, indium, palladium, chromium, molybdenum and alloys thereof (e.g., nickel-cobalt, nickel-iron, nickel-molybdenum or the so-called polyalloy systems) can be deposited and fall within the scope of this invention.

Further examples of secondary electroless overlayer coatings, applied over the primary underlayer electroless copper, are herewith given:

EXAMPLE 2

| Electroless Cobalt (Overlayer) Bath | |
|---|---|
| Bath Composition: | |
| Cobalt chloride ($CoCl_2.6H_2O$) | 30 grams/liter |
| Sodium hypophosphite ($NaH_2PO_2.H_2O$) | 20 grams/liter |

| Electroless Cobalt (Overlayer) Bath | |
|---|---|
| Sodium citrate (Na$_3$C$_6$H$_5$O$_6$ . 2 H$_2$O) | 35 grams/liter |
| Ammonium chloride (NH$_4$Cl) | 50 grams/liter |
| Operating conditions: | |
| Temperature | 70–90° C. |
| pH | 9–10 |
| Time | 20–30 minutes |
| Deposition rate | .6 mils/hour |

EXAMPLE 3

| Electroless Nickel-Cobalt Polyalloy (Overlayer) Bath | |
|---|---|
| Bath Composition: | |
| Cobalt Chloride (CoCl$_2$ . 6H$_2$O) | 30 grams/liter |
| Nickel chloride (NiCl$_2$ . 6H$_2$O) | 30 grams/liter |
| Rochelle salt (NaKC$_4$H$_4$O$_6$ . 4H$_2$O) | 200 grams/liter |
| Ammonium chloride (NH$_4$Cl) | 50 grams/liter |
| Sodium hypophosphite (NaH$_2$PO$_2$ . H$_2$O) | 20 grams/liter |
| Operating Conditions: | |
| Temperature | 70–90° C. |
| pH | 8–10 |
| Time | 20–30 minutes |
| Deposition rate | .6 mils/hour |

EXAMPLE 4

| Electroless Gold (Overlayer) Bath | |
|---|---|
| Bath Composition: | |
| Gold Chloride (AuCl$_3$ . 2H$_2$O) | 60 grams/liter |
| Ammonium chloride (NH$_4$Cl) | 75 grams/liter |
| Sodium citrate (Na$_3$C$_6$H$_5$O$_7$ . 2 H$_2$O) | 50 grams/liter |
| Sodium hypophosphite (NaH$_2$PO$_2$ . H$_2$O) | 10 grams/liter |
| Operating Conditions: | |
| Temperature | 70–90° C. |
| pH | 7–8 |
| Time | 5–10 minutes |
| Deposition rate | .3 mil/hour |

Metal salts other than those shown in the EXAMPLES 2, 3, 4 formulations can be employed. For example, in lieu of nickel sulphate, chloride, acetate, ammonium sulphate salts of nickel can be used. Cobalt sulphate, acetate, and ammonium chloride can replace cobalt chloride. Potassium gold cyanide salt can be the source of metallic gold instead of gold chloride.

In place of sodium hypophosphite which is the reducing agent in the formulations, dimethylamine borane (DMAB) and sodium borohydride (NaBH$_4$) can be employed. The electroless deposit would then contain boron as an alloy instead of phosphorus. Citric acid can be used to replace sodium citrate.

Within the scope of this invention are the various brighteners utilized in these so-called secondary electroless baths. In EXAMPLES 1–4, commercial or proprietary brighteners are used to achieve the desired brightness. Heretofore these brighteners were only employed in any commercially significant way as far as is known in connection with electrolytic baths and not in connection with electroless baths such as those exemplified in this disclosure. In EXAMPLES 1, 2 and, wherein electroless deposits of nickel, cobalt, and the nickel-cobalt polyalloy were applied to the electroless copper (the underlayer), certain carefully selected brighteners normally used for electrolytic nickel plating worked highly satisfactorily under properly controlled conditions; for example, brightener concentration, bath ingredient composition, temperature and pH. These brighteners are of the first and second class well-known to the artisan.

The first class (=C—SO$_2$—) brighteners consist of sulfonic acids, sulfonates, sulfonamides, sulfonimides, etc., linked chemically with naphthalene, benzene, toluene, naphthylamine, etc. The second class of brighteners contain metal ions such as selenium, cadmium, sulphur, thioureas, etc.

I have found that p-toluene-sulfamide or sodium benzene disulfonate as a first class brightener and cadmium sulfate as a second class brightener, in concentrations in the range of 0.5–2.0 grams per liter, worked well in the secondary electroless baths of nickel, cobalt and nickel-cobalt polyalloy. Likewise, o-benzoyl sulfimide and p-amino phenol as first class brighteners and cadmium sulfate, lead acetate and sodium thiosulfate as second class addition agents brought about brightness especially in the cobalt and nickel-cobalt alloy electroless baths.

The electroless gold bath electrolessly plated brightly using tetraethylene pentamines and triethylamine in concentrations of 1–2 grams per liter as single brighteners.

Many of the aforementioned brighteners which, as previously stated, are usually recommended only for electrolytic plating solutions.

It is important to again stress that the primary electroless copper (the underlayer) and the secondary electroless bath (the overlayer) shown in EXAMPLES 1, 2, 3, 4 must be employed jointly for the best practice of this invention. Likewise, it is important to point out that the improvement over existing commercial processes lies in the fact that no subsequent electroplating of the electroless film is necessary when this dual electroless system is used.

Furthermore, within the scope of this invention, is an important industrial process of selective electroless coating made possible only by utilization of the process disclosed above.

An automotive radio knob, for example, molded out of black ABS material is electrolessly coated with the primary electroless copper described above. The center section of this know is machined on a wood turning lathe or similar equipment (e.g., on a miller, shaper, grinder, etc.) to remove the relatively thin layer of this ductile, machinable primary copper from the center section of the knob to expose the original black plastic substrate. The part then receives the bright secondary electroless metal by immersion in the electroless bath to produce the desired metal. The net result is a bright automotive knob metallized all over with the bright metal except at the center section where the originally molded black ABS plastic is exposed. In other words, an attractive combination of metal and plastic is achieved.

The intermediate machining step obliterates surface activation history in the treated area so that no secondary metal adheres to the mechanically treated portion. No finishing steps are necessary other than rinsing in water.

Prior methods employed to accomplish selective metallizing required the use of costly spray masks or stencils in conjunction with stop off paints or inks or silk screen or photographic procedures as used in printed circuitry, hot stamping, adhesive-backed inserts, two-shot molding, etc.

Furthermore, since the disclosed process is a totally electroless method requiring no subsequent electroplating, costly complex racking for electrical connection is totally eliminated. Hence, the net result is a low cost selective plating process.

Other applications for selectively decorating plastic items for the novelty field include selective plating of jewelry items, buttons, placques, etc. A variety of geometric designs are now available. In mass production, automatic cutting machines can be adapted economically to remove the primary electroless copper in the predetermined areas prior to the application of the bright secondary metal.

Although the invention has been described and illustrated in detail, it is clearly understood that the same is by way of illustration and example only and is not taken by way of limitation, the spirit and scope of this invention being limited only by the terms of the appended claims which follow.

What is claimed is:

1. Method of electroless metal coating to produce a bright metal of high reflectivity and adhesion comprising,
   treating a substrate surface to prepare it for electroless coating,
   then treating the entirety of said surface with a primary electroless copper coating solution maintained at a basic pH of 11.5–13.5 and containing a copper chelating agent,
   and coating the surface with copper at 0.2–0.4 mils per hour,
   then treating the said surface with a secondary electroless metal coating solution maintained at its characteristic electroless coating pH,
   the secondary solution comprising sufficient phosphorus and being controlled to produce 6–12 weight percent phosphorus in the final coating produced from the secondary coating solution.

2. The method of claim 1 wherein the overlayer coating solutions contain $AH_2PO_2.H_2O$ where A is selected from the class consisting of alkali metal and ammonium ions.

3. The method of claim 1 wherein a portion of the primary copper layer is removed prior to treating the primary nickel coated substrate with the secondary electroless coating solution.

4. The method of claim 1 wherein both primary and secondary treating steps comprise immersion of the substrate.

5. The method of claim 1 wherein the substrate preparation treatment comprises etching, catalyst deposition for activation and acceleration by surface attack.

6. Method of nickel coating comprising,
   etching and activating the surface of one or more substrate articles in a single step,
   acceleration treatment of the substrate surfaces,
   immersing of the substrates in a primary copper solution maintained at 25°–35° C. and pH of 11.5–13.5 for 5–15 minutes to produce a primary copper coating thereon at 0.2–0.4 mils per hour,
   and then immersing the substrate without rinsing or neutralization, into a secondary electroless metal coating solution maintained at temperature and pH to produce a self building brightening of the surfaces,
   the secondary solution comprising sufficient phosphorus and being controlled to produce 6–12 weight percent phosphorus in the final coating produced from the secondary coating solution.

7. Method of nickel coating in accordance with claim 6 wherein a portion of the primary coating is removed prior to the said second immersion of the substrates into nickel solution.

8. Method in accordance with claim 6 wherein said primary copper solution comprises copper sulfate
   and a basic mixture including glacial acetic acid and ammonium hydroxide and said secondary metal solution comprises sulphate salt of the metal, sodium hypophosphite and a weak acid mixture.

9. Method of electroless metal coating to produce a bright metal of high reflectivity and adhesion comprising,
   treating a nonconductive substrate to prepare it for electroless coating,
   then applying a primary copper underlayer to the substrate by simultaneous reduction of a copper compound while dissolved in an electroless bath in contact with the substrate while chelating copper ions therein and at a rate of 0.2–0.4 mils per hour,
   then applying a secondary metal coating to the said copper surfaced substrate by electroless coating,
   the secondary solution comprising sufficient phosphorus and being controlled to produce 6–12 weight percent phosphorus in the final coating produced from the secondary coating solution.

10. The method of claim 9 wherein the primary electroless coating utilizes an organic reducing agent compound having multiple bonds.

* * * * *